United States Patent
Ookubo et al.

(10) Patent No.: US 11,099,480 B2
(45) Date of Patent: Aug. 24, 2021

(54) TREATMENT SOLUTION SUPPLY APPARATUS AND TREATMENT SOLUTION SUPPLY METHOD

(71) Applicant: Tokyo Electron Limited, Tokyo (JP)

(72) Inventors: Takahiro Ookubo, Koshi (JP); Suguru Enokida, Koshi (JP); Toshinobu Furusho, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/393,042

(22) Filed: Apr. 24, 2019

(65) Prior Publication Data

US 2019/0332014 A1 Oct. 31, 2019

(30) Foreign Application Priority Data

Apr. 26, 2018 (JP) .............................. JP2018-085058

(51) Int. Cl.
*G03F 7/16* (2006.01)
*B05C 11/10* (2006.01)

(52) U.S. Cl.
CPC .......... *G03F 7/162* (2013.01); *B05C 11/1002* (2013.01); *B05C 11/1013* (2013.01); *B05C 11/1026* (2013.01); *B05C 11/1044* (2013.01)

(58) Field of Classification Search
CPC . G03F 7/162; B05C 11/1002; B05C 11/1044; B05C 11/1013; B05C 11/1026; B05C 11/1034; B05C 11/1039
See application file for complete search history.

(56) References Cited

U.S. PATENT DOCUMENTS

| 6,033,475 A * | 3/2000 | Hasebe | B01D 19/0031 118/320 |
| 6,391,111 B1 * | 5/2002 | Fujimoto | B05C 11/1026 118/320 |
| 2003/0180471 A1 * | 9/2003 | Takekuma | H01L 21/67253 430/271.1 |
| 2018/0272377 A1 * | 9/2018 | Sadri | B05C 11/1007 |

FOREIGN PATENT DOCUMENTS

JP          2013-211525 A      10/2013

* cited by examiner

*Primary Examiner* — Dah-Wei D. Yuan
*Assistant Examiner* — Stephen A Kitt
(74) *Attorney, Agent, or Firm* — Posz Law Group, PLC

(57) ABSTRACT

A treatment solution supply apparatus supplies a treatment solution to a solution treatment apparatus which applies the treatment solution to a substrate to perform a predetermined treatment. Plural solution treatment apparatuses are supply destinations of the treatment solution. The treatment solution supply apparatus includes: a sending unit common among the solution treatment apparatuses, the sending unit sends the treatment solution stored in a treatment solution supply source to each of the solution treatment apparatuses; and a control unit that controls the sending unit. The sending unit includes pumps that suck the treatment solution and load the treatment solution thereinto and send the loaded treatment solution. The control unit controls suction timing of each of the pumps so that one (or more) of the pumps becomes in a state capable of sending the treatment solution to the solution treatment apparatuses at all times.

4 Claims, 15 Drawing Sheets

TREATMENT SOLUTION SUPPLY APPARATUS AND TREATMENT SOLUTION SUPPLY METHOD

CROSS REFERENCE TO RELATED APPLICATIONS

This application is based upon and claims the benefit of priority of the prior Japanese Patent Application No. 2018-85058, filed in Japan on Apr. 26, 2018, the entire contents of which are incorporated herein by reference.

BACKGROUND OF THE INVENTION

1. Field of the Invention

The present invention relates to a treatment solution supply apparatus and a treatment solution supply method.

2. Description of the Related Art

In a photolithography process in a manufacturing process of a semiconductor device, for example, a series of treatments such as a resist coating treatment of applying a resist solution onto the surface of a semiconductor wafer (hereinafter, referred to as a "wafer") as a substrate to form a resist film, exposure processing of exposing the resist film to a predetermined pattern, a developing treatment of developing the exposed resist film and so on are performed in sequence to form a predetermined resist pattern on the wafer. The series of treatments are performed in a coating and developing treatment system being a substrate treatment system including various treatment apparatuses that treat the wafer, transfer mechanisms that transfer the wafer and so on. Further, in the coating and developing treatment system, solution treatment apparatuses which apply treatment solutions such as a resist solution, a developing solution and so on used in the photolithography process to the wafer to thereby perform solution treatments are provided as the above treatment apparatuses.

Further, a treatment solution supply apparatus which supplies the treatment solution to the solution treatment apparatus is provided in the coating and developing treatment system. The treatment solution supply apparatus includes, for example, a treatment solution supply source which stores the treatment solution, an intermediate tank which temporarily stores the treatment solution from the treatment solution supply source, and a pump which supplies the treatment solution stored in the intermediate tank to a coating nozzle of the solution treatment apparatus via a treatment solution supply pipe. Further, in the treatment solution supply apparatus, a filter which removes a foreign substance (particle) from the treatment solution is provided in the treatment solution supply pipe (refer to Japanese Laid-open Patent Publication No. 2013-211525).

Further, in Japanese Laid-open Patent Publication No. 2013-211525, in a coating and developing treatment system, a plurality of solution treatment apparatuses of the same kind are provided, and, for example, a plurality of resist coating apparatuses each of which applies a resist solution to a wafer to form a resist film are provided. In the coating and developing treatment system in which the plurality of solution treatment apparatuses of the same kind are provided as described above, conventionally, a treatment solution supply apparatus is independently provided for each of the solution treatment apparatuses.

SUMMARY OF THE INVENTION

Incidentally, in the case where the treatment solution supply apparatus is independently provided for each of the solution treatment apparatuses as described above in the coating and developing treatment system in which the plurality of solution treatment apparatuses of the same kind are provided, the state of the treatment solution supply apparatus differs in each of the solution treatment apparatuses. Specifically, the states of a pump and a filter of the treatment solution supply apparatus differ among the solution treatment apparatuses. If the states of the pump and the filter of the treatment solution supply apparatus differ among the solution treatment apparatuses as above, the amount of particles in the treatment solution supplied from the treatment solution supply apparatus and discharged from the coating nozzle of the solution treatment apparatus to the wafer and the amount of defects within the wafer subjected to the solution treatment using the treatment solution differ among the solution treatment apparatuses. As a result, the quality management in manufacturing a semiconductor chip as a product becomes complicated.

Japanese Laid-open Patent Publication No. 2013-211525 does not take the difference in the above-described state of the treatment solution supply apparatus among the solution treatment apparatuses into consideration. Accordingly, there is room for improvement of the conventional treatment solution supply apparatus.

The technique according to this disclosure has been made in consideration of the above circumstances, and provides a treatment solution supply apparatus and a treatment solution supply method easily managing the quality.

One aspect of the technique according to this disclosure is a treatment solution supply apparatus for supplying a treatment solution to a solution treatment apparatus which applies the treatment solution to a substrate to perform a predetermined treatment, there being a plurality of solution treatment apparatuses which are supply destinations of the treatment solution, the treatment solution supply apparatus including: a sending unit common among the plurality of solution treatment apparatuses, the sending unit being configured to send the treatment solution stored in a treatment solution supply source which stores the treatment solution, to each of the plurality of solution treatment apparatuses; and a control unit configured to control at least the sending unit, wherein the sending unit includes a plurality of pumps configured to suck the treatment solution and load the treatment solution thereinto and to send the loaded treatment solution, and wherein the control unit is configured to control suction timing of each of the plurality of pumps so that at least one of the plurality of pumps becomes a state capable of sending the treatment solution to the plurality of solution treatment apparatuses at all times.

According to one aspect of the technique according to this disclosure, since the treatment solution supply apparatus is common among the solution treatment apparatuses, it is possible to prevent the amount of particles in the treatment solution supplied from the treatment solution supply apparatus and discharged from the treatment solution coating unit of the solution treatment apparatus to the substrate and the amount of defects within the substrate subjected to the solution treatment using the treatment solution, from differing among the solution treatment apparatuses. Accordingly, the quality management in manufacturing the products such as the semiconductor chip and so on is easy. Further, the treatment solution supply apparatus is common among the solution treatment apparatuses, so that the number of parts such as the pump and so on can be reduced to suppress the manufacturing cost. Furthermore, since the suction/loading timing of the treatment solution of each of the plurality of pumps is controlled so that at least one of the plurality of pumps becomes a state capable of sending the treatment solution to the plurality of solution treatment apparatuses at all times, the discharge of the treatment solution from the treatment solution coating unit of the solution treatment apparatus is never hindered by the suction/loading.

One aspect of the technique according to this disclosure according to another viewpoint is a treatment solution supply method using a treatment solution supply apparatus for supplying a treatment solution to a solution treatment apparatus which applies the treatment solution to a substrate to perform a predetermined treatment, there being a plurality of solution treatment apparatuses which are supply destinations of the treatment solution, the treatment solution supply apparatus including: a sending unit common among the plurality of solution treatment apparatuses, the sending unit being configured to send the treatment solution stored in a treatment solution supply source which stores the treatment solution, to each of the plurality of solution treatment apparatuses, wherein the sending unit includes a plurality of pumps configured to suck the treatment solution and load the treatment solution thereinto and to send the loaded treatment solution, the treatment solution supply method including: supplying the treatment solution from some of the plurality of pumps to all or some of the plurality of solution treatment apparatuses; and loading, when some of the plurality of pumps are in a state capable of sending the treatment solution to the plurality of solution treatment apparatuses, the treatment solution to other of the pumps included in the plurality of pumps.

According to one aspect of the technique according to this disclosure, quality management can be easily performed.

DETAILED DESCRIPTION OF THE INVENTION

Figure 1:
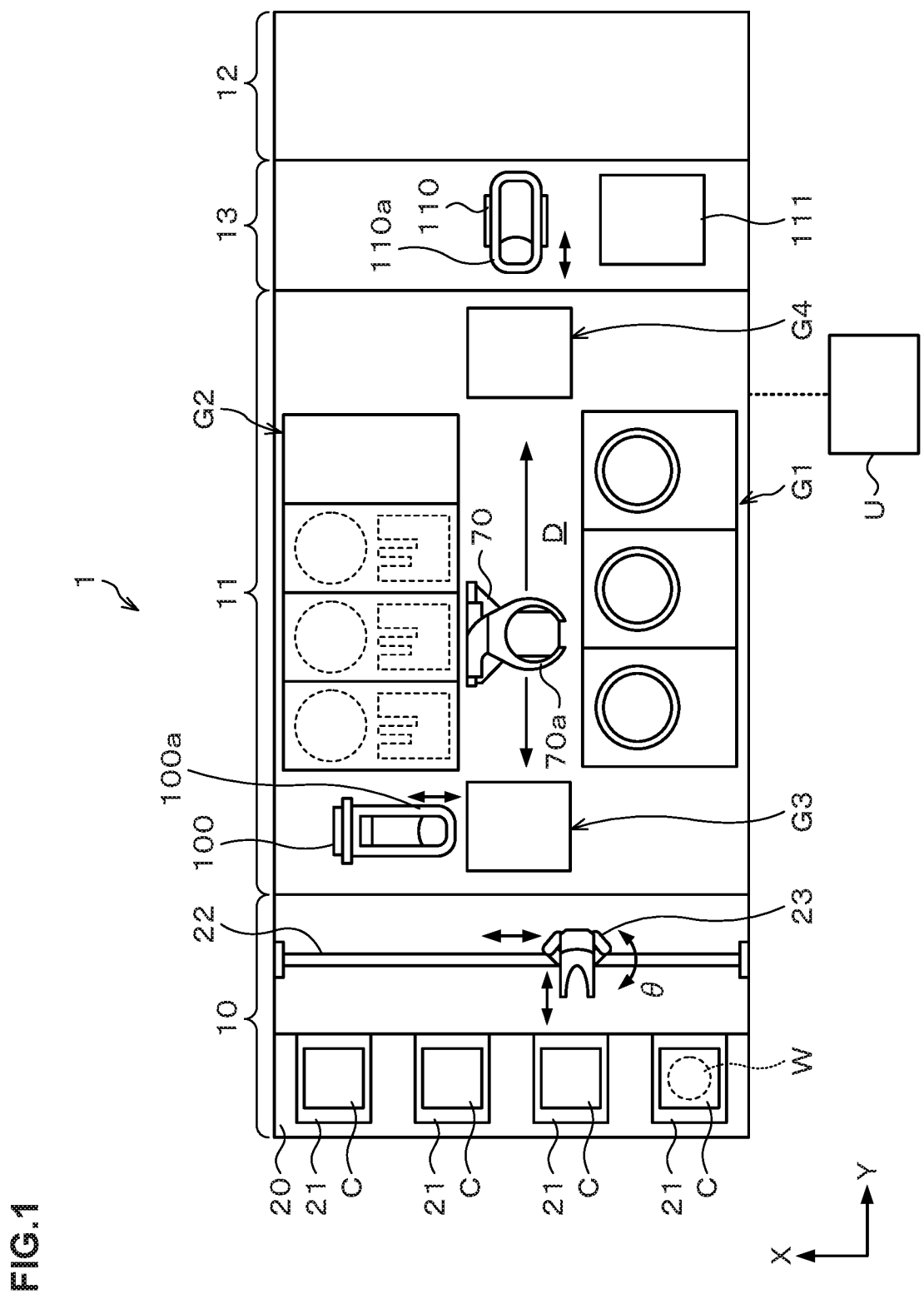
FIG. 1 is a plan view illustrating the outline of the configuration of a substrate treatment system according to this embodiment.

Hereinafter, this embodiment will be explained referring to the drawings. Note that in this specification and the drawings, the same codes are given to components having substantially the same functional configurations to omit duplicated explanation.

Figure 2:
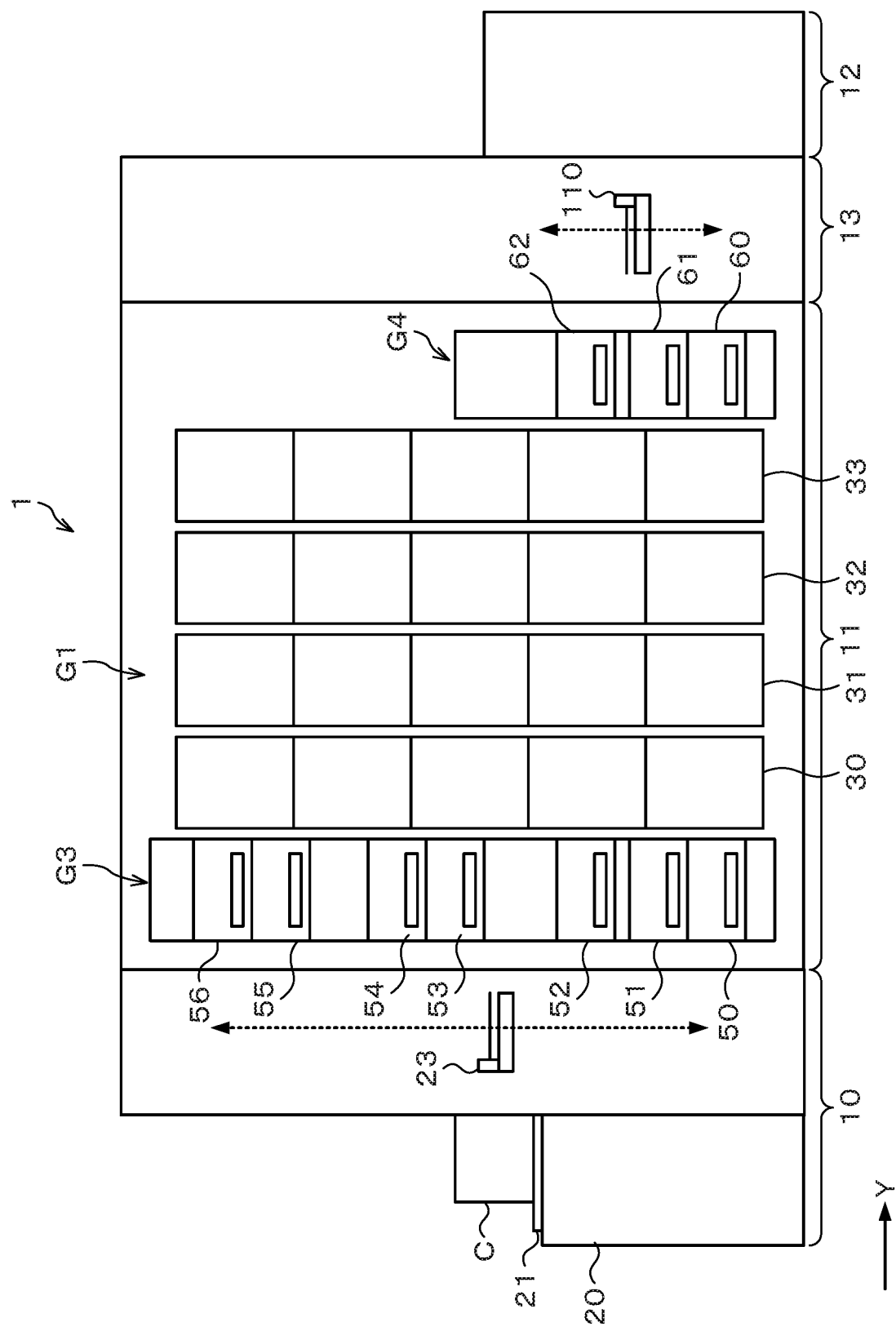
FIG. 2 is a front view illustrating the outline of the configuration of the substrate treatment system according to this embodiment.
Figure 3:
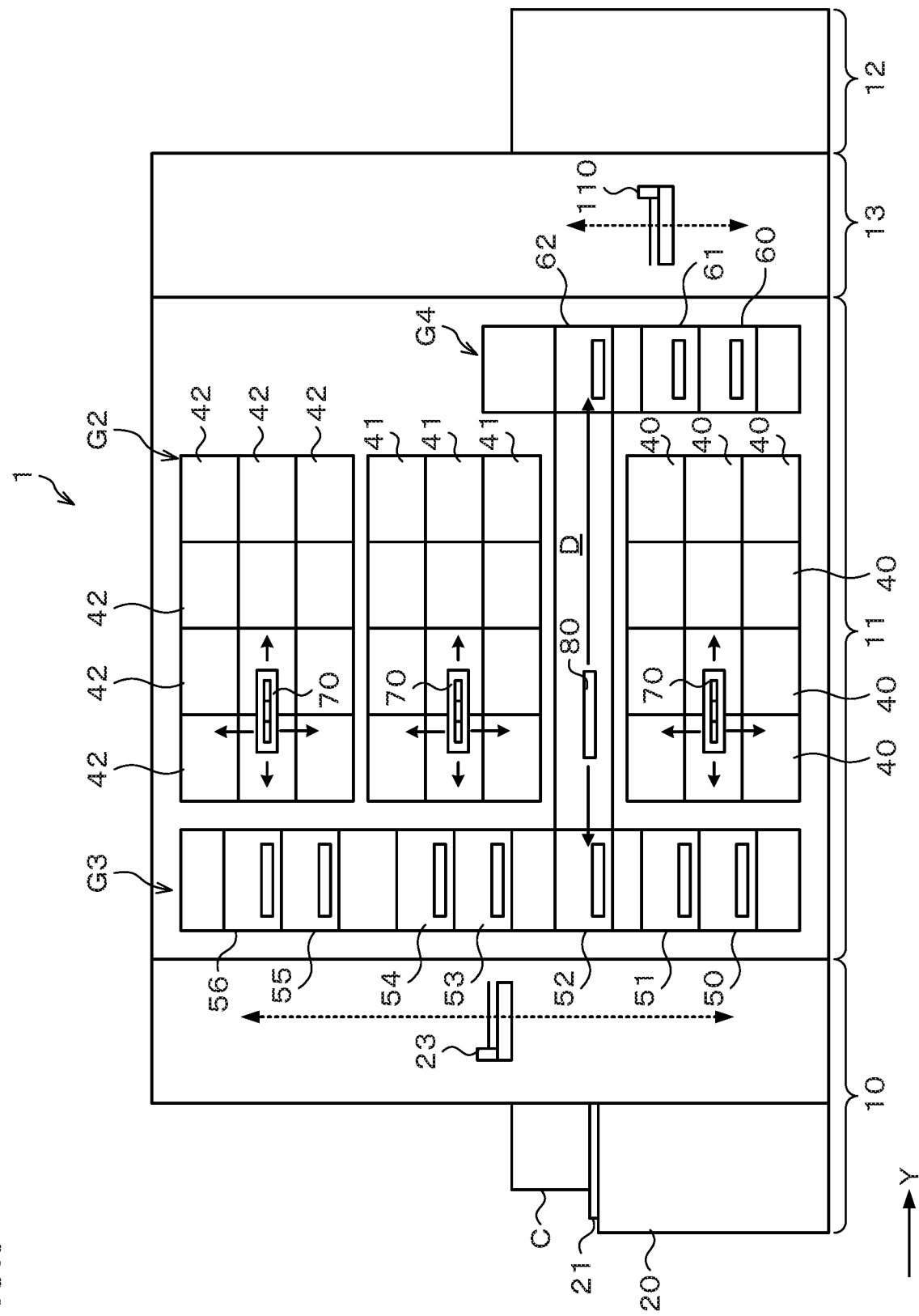
FIG. 3 is a rear view illustrating the outline of the configuration of the substrate treatment system according to this embodiment.

FIG. 1 is an explanatory view illustrating the outline of the configuration of a substrate treatment system 1 equipped with a resist solution supply apparatus as a treatment solution supply apparatus according to this embodiment. FIG. 2 and FIG. 3 are a front view and a rear view schematically illustrating the outline of the internal configuration of the substrate treatment system 1, respectively.

The substrate treatment system 1 has, as illustrated in FIG. 1, a configuration in which a cassette station 10 into/out of which a cassette C housing a plurality of wafers W as substrates is transferred, a treatment station 11 which includes a plurality of various treatment apparatuses each performing a predetermined treatment on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a longitudinal direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 each including various apparatuses are provided. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, a developing treatment apparatus 30 which performs a developing treatment on the wafer W, a lower anti-reflection film forming apparatus 31 which forms an anti-reflection film (hereinafter, referred to as a "lower anti-reflection film") at a lower layer of a resist film of the wafer W, a resist coating apparatus 32 which applies a resist solution to the wafer W to form a resist film, and an upper anti-reflection film forming apparatus 33 which forms an anti-reflection film (hereinafter, referred to as an "upper anti-reflection film") at an upper layer of the resist film of the wafer W, are arranged side by side in the horizontal direction.

For example, the developing treatment apparatus 30, the lower anti-reflection film forming apparatus 31, the resist coating apparatus 32, and the upper anti-reflection film forming apparatus 33 are arranged five each to be layered in the vertical direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the solution treatment apparatuses such as the developing treatment apparatus 30, the lower anti-reflection film forming apparatus 31, the resist coating apparatus 32, and the upper anti-reflection film forming apparatus 33, for example, spin coating of applying a predetermined treatment solution onto the wafer W is performed. In the spin coating, the treatment solution is discharged, for example, from a coating nozzle onto the wafer W and the wafer W is rotated to diffuse the treatment solution over the surface of the wafer W.

For example, in the second block G2, as illustrated in FIG. 3, thermal treatment apparatuses 40 to 42 each of which performs thermal treatments such as heating and cooling on the wafer W are provided one on the top of the other in the vertical direction and side by side in the horizontal direction. The numbers and the arrangement of the thermal treatment apparatuses 40 to 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm 100a movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a movable, for example, in the Y-direction, the θ-direction, and the vertical direction. The wafer transfer apparatus 110 can transfer the wafer W to/from each of the delivery apparatuses in the fourth block G4, the delivery apparatus 111, and the exposure apparatus 12, for example, while supporting the wafer W by the transfer arm 110a.

In the above substrate treatment system 1, a control unit U is provided as illustrated in FIG. 1. The control unit U is composed of, for example, a computer including a CPU, a memory and so on, and includes a program storage unit (not illustrated). In the program storage unit, a program for controlling the treatments on the wafer W in the substrate treatment system 1 including a supply treatment of the treatment solution is stored. Note that the program may be the one that is recorded, for example, in a computer-readable storage medium such as a computer-readable hard disk (HD), flexible disk (FD), compact disk (CD), magneto-optical disk (MO), or memory card, and installed from the storage medium into the control unit U. Besides, a part or all of the program may be realized by dedicated hardware (circuit board).

Next, the outline of the wafer treatment performed using the substrate treatment system 1 configured as above will be explained. First, a cassette C housing a plurality of wafers W is transferred into the cassette station 10 of the substrate treatment system 1, and each of the wafers W in the cassette C is successively transferred by the wafer transfer apparatus 23 to the delivery apparatus 53 in the treatment station 11.

Then, the wafer W is transferred by the wafer transfer apparatus 70 to the thermal treatment apparatus 40 in the second block G2 and subjected to a temperature regulation treatment. Thereafter, the wafer W is transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2 and subjected to a heat treatment.

Thereafter, the wafer W is transferred by the wafer transfer apparatus 70 to the resist coating apparatus 32 in the first block G1, in which a resist film is formed on the wafer W. The wafer W is then transferred to the thermal treatment apparatuses 40 and subjected to a pre-baking treatment.

Then, the wafer W is transferred to the upper anti-reflection film forming apparatus 33 in the first block G1, in which an upper anti-reflection film is formed on the wafer W. The wafer W is then transferred to the thermal treatment apparatus 40 in the second block G2 and subjected to a heat treatment. Thereafter, the wafer W is transferred by the wafer transfer apparatus 70 to the delivery apparatus 56 in the third block G3.

Then, the wafer W is transferred by the wafer transfer apparatus 100 to the delivery apparatus 52, and transferred by the shuttle transfer apparatus 80 to the delivery apparatus 62 in the fourth block G4. The wafer W is then transferred by the wafer transfer apparatus 110 in the interface station 13 to the exposure apparatus 12 and subjected to exposure processing in a predetermined pattern.

Then, the wafer W is transferred by the wafer transfer apparatus 70 to the thermal treatment apparatus 40 and subjected to a post-exposure baking treatment. This causes a deprotection reaction with an acid generated at an exposed portion of the resist film. The wafer W is thereafter transferred by the wafer transfer apparatus 70 to the developing treatment apparatus 30 and subjected to a developing treatment.

After the development ends, the wafer W is transferred by the wafer transfer apparatus 70 to the thermal treatment apparatus 40 and subjected to a post-bake treatment.

The wafer W is then transferred by the wafer transfer apparatus 70 to the delivery apparatus 50 in the third block G3, and transferred by the wafer transfer apparatus 23 in the cassette station 10 to the cassette C on a predetermined cassette mounting plate 21. Thus, a series of photolithography process ends.

Figure 4:
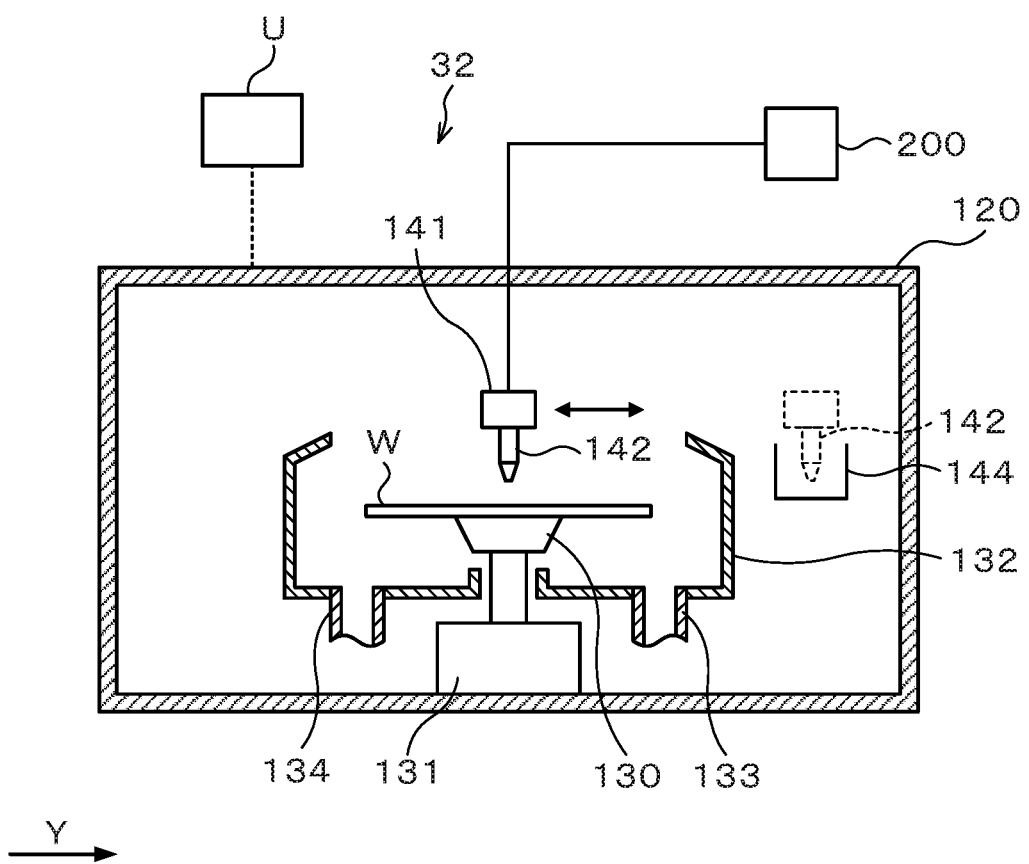
FIG. 4 is a longitudinal sectional view illustrating the outline of the configuration of a resist coating apparatus.
Figure 5:
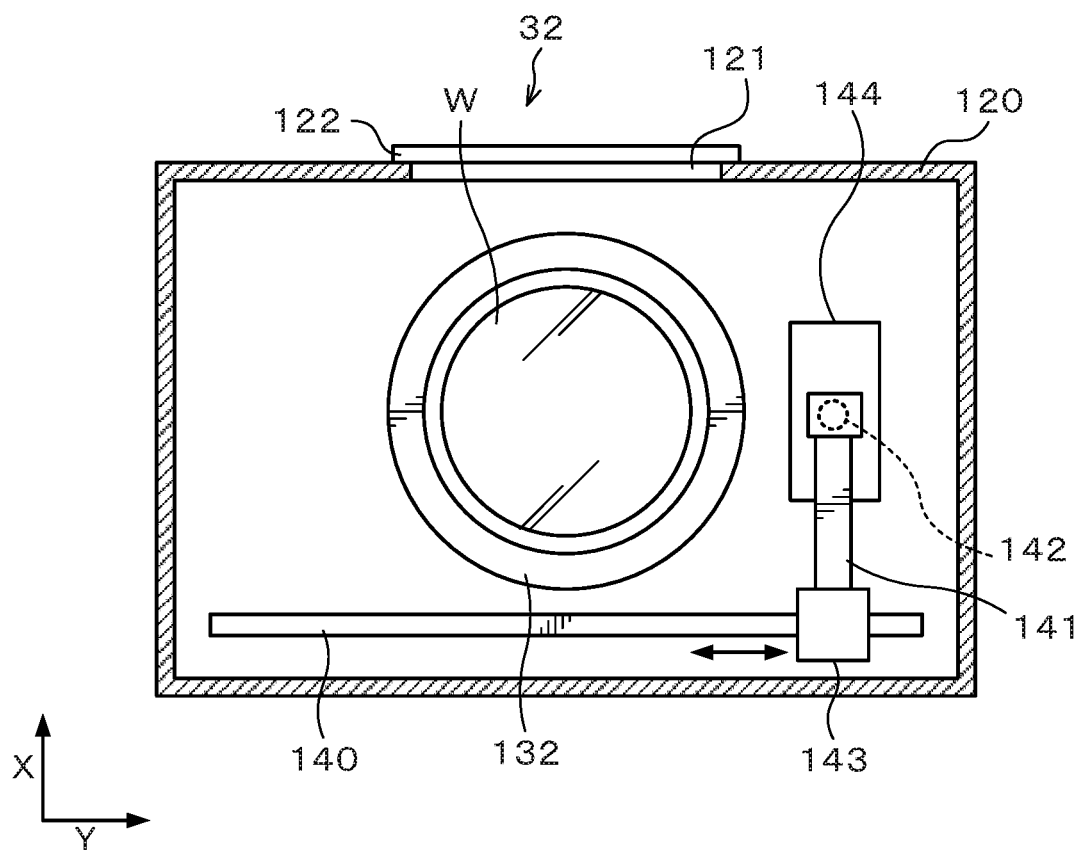
FIG. 5 is a transverse sectional view illustrating the outline of the configuration of the resist coating apparatus.

Next, the configuration of the aforementioned resist coating apparatus 32 will be explained. FIG. 4 is a longitudinal sectional view illustrating the outline of the configuration of the resist coating apparatus 32, and FIG. 5 is a transverse sectional view illustrating the outline of the configuration of the resist coating apparatus 32.

The resist coating apparatus 32 has a treatment container 120 whose inside can be hermetically closed as illustrated in FIG. 4. A side surface of the treatment container 120 is formed with a transfer-in/out port 121 for the wafer W as illustrated in FIG. 5, and an open/close shutter 122 is provided at the transfer-in/out port 121.

At a central portion in the treatment container 120, a spin chuck 130 is provided which holds and rotates the wafer W thereon as illustrated in FIG. 4. The spin chuck 130 has a horizontal upper surface, and the upper surface is provided with, for example, a suction port (not illustrated) for sucking the wafer W. By suction through the suction port, the wafer W can be suction-held on the spin chuck 130.

The spin chuck 130 has a chuck drive mechanism 131 equipped with, for example, a motor and the like and can rotate at a predetermined speed by the chuck drive mechanism 131. Further, the chuck drive mechanism 131 is provided with a raising and lowering drive source such as a cylinder so that the spin chuck 130 can freely move up and down.

Around the spin chuck 130, a cup 132 is provided which receives and collects liquid splashing or dropping from the wafer W. A drain pipe 133 which drains the collected liquid and an exhaust pipe 134 which exhausts the atmosphere in the cup 132 are connected to the lower surface of the cup 132.

As illustrated in FIG. 5, on an X-direction negative direction (lower direction in FIG. 5) side of the cup 132, a rail 140 is formed which extends along a Y-direction (right-left direction in FIG. 5). The rail 140 is formed, for example, from a Y-direction negative direction (left direction in FIG. 5) side outer position to a Y-direction positive direction (right direction in FIG. 5) side outer position of the cup 132. To the rail 140, an arm 141 is attached.

On the arm 141, a coating nozzle 142 which discharges the resist solution is supported as illustrated in FIG. 4 and FIG. 5. The arm 141 is movable on the rail 140 by a nozzle drive unit 143 illustrated in FIG. 5. This allows the coating nozzle 142 to move from a waiting section 144 set at the Y-direction positive direction side outer position of the cup 132 to a position above the center portion of the wafer W in the cup 132, and further move in a radial direction of the wafer W above the surface of the wafer W. Further, the arm 141 freely rises and lowers by the nozzle drive unit 143 to be able to adjust the height of the coating nozzle 142. The coating nozzle 142 is connected to a resist solution supply apparatus 200 which supplies the resist solution as illustrated in FIG. 4.

Figure 6:
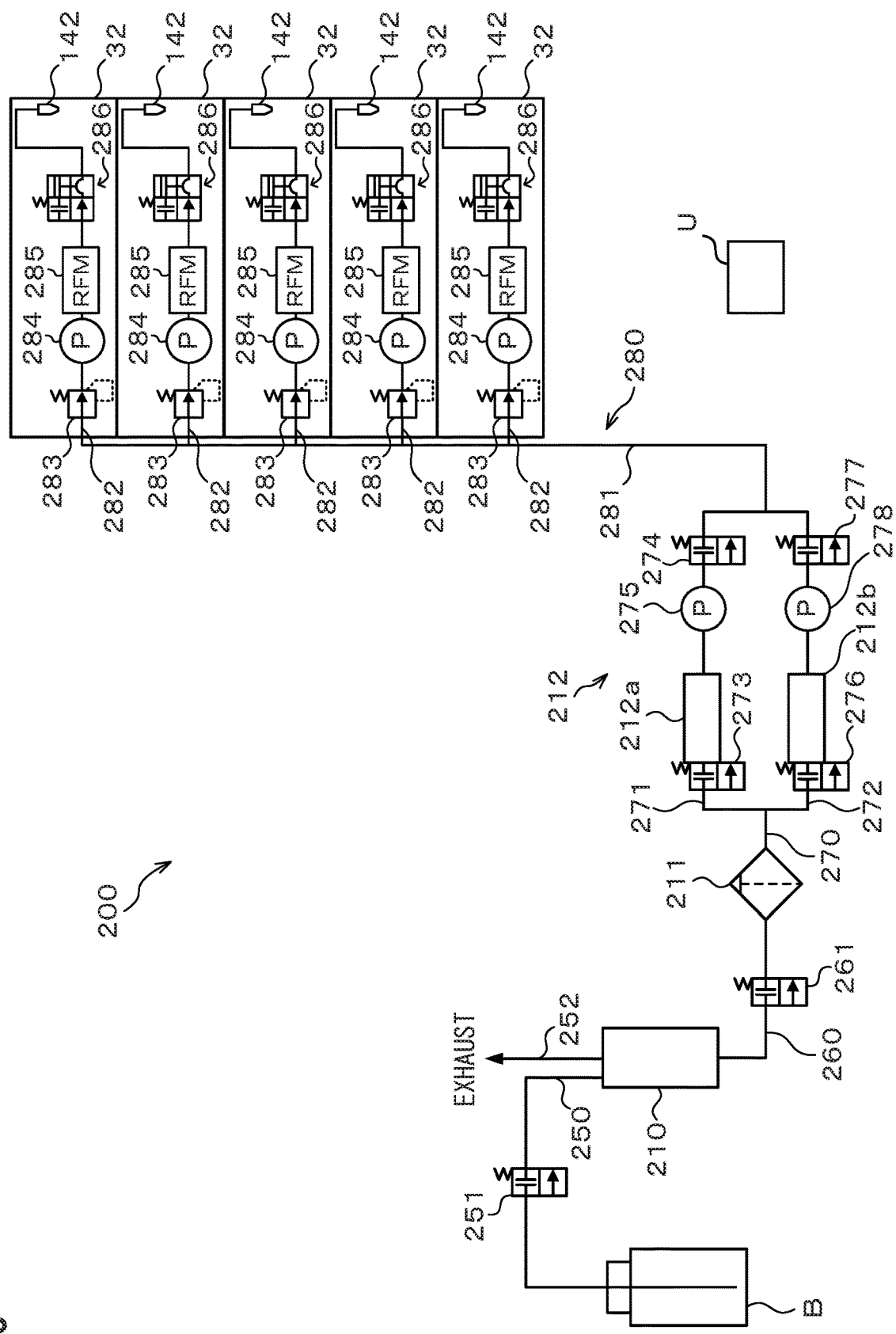
FIG. 6 is an explanatory diagram illustrating the outline of the configuration of a resist solution supply apparatus according to this embodiment.

Next, the configuration of the resist solution supply apparatus 200 which supplies the resist solution to the coating nozzle 142 as a treatment solution coating unit in the resist coating apparatus 32 will be explained. FIG. 6 is an explanatory diagram illustrating the outline of the configuration of the resist solution supply apparatus 200. Note that, for example, a portion of the resist solution supply apparatus 200 from a later-described resist solution bottle B to a sending unit 212 is provided in a not-illustrated chemical chamber. The chemical chamber is provided in the substrate treatment system 1 in order to supply various kinds of treatment solutions to the solution treatment apparatuses.

There are a plurality of (five in this example) resist coating apparatuses 32 which are supply destinations of the resist solution from the resist solution supply apparatus 200 in FIG. 6, that is, the resist solution supply apparatus 200 is common among the plurality of resist coating apparatuses 32. The resist solution supply apparatus 200 includes a buffer tank 210, a filter 211, and the sending unit 212 in order from the upstream side between the resist solution bottle B as a treatment solution supply source which stores the resist solution therein and the coating nozzle 142.

The buffer tank 210 is a temporary storage apparatus which temporarily stores the resist solution transported from the exchangeable resist solution bottle B and is composed of, for example, a variable displacement pump. The buffer tank 210 is intended to prevent stop of the supply of the resist solution to the coating nozzle 142 during exchange of the resist solution bottles B. Further, the buffer tank 210 and the resist solution bottle B are connected with each other by a first supply pipe 250, and the first supply pipe 250 is provided with a supply valve 251 which opens and closes its flow path. Note that at an upper end of the buffer tank 210, an exhaust pipe 252 is provided which releases an inert gas accumulated at an upper portion of the buffer tank 210 to the atmosphere.

The filter 211 is intended to filter the resist solution and collect and remove a foreign substance in the resist solution. A primary side of the filter 211 and a bottom side of the buffer tank 210 are connected with each other by a second supply pipe 260, and the second supply pipe 260 is provided with an opening/closing valve 261 which opens and closes its flow path.

The sending unit 212 is intended to send the resist solution to respective coating nozzles 142 of the plurality of resist coating apparatuses 32, and is common among the plurality of resist coating apparatuses 32. The sending unit 212 is located below the resist coating apparatuses 32. The sending unit 212 includes two, that is, a first pump 212a and a second pump 212b in parallel to each other which suck the resist solution and load it thereinto and send the loaded resist solution.

A primary side of the sending unit 212 and a secondary side of the filter 211 are connected with each other by a third supply pipe 270. At a downstream end of the third supply pipe 270, a branch pipe 271 for first pump and a branch pipe 272 for second pump are connected in parallel.

The branch pipe 271 for first pump is provided with a first pump 212a, and an opening/closing valve 273 and an opening/closing valve 274 are provided on the upstream side and the downstream side of the first pump 212a, respectively. Further, between the first pump 212a and the opening/closing valve 274 on the branch pipe 271 for first pump, a pressure sensor 275 is provided.

Further, the branch pipe 272 for second pump is provided with a second pump 212b, and an opening/closing valve 276 and an opening/closing valve 277 are provided on the upstream side and the downstream side of the second pump 212b, respectively. Further, between the second pump 212b and the opening/closing valve 277 on the branch pipe 272 for second pump, a pressure sensor 278 is provided.

The opening/closing valves 273, 274, 276, 277 open and close the flow paths of the branch pipe 271 for first pump and the branch pipe 272 for second pump. Further, the pressure sensor 275 measures the pressure inside the branch pipe 271 for first pump, and the pressure sensor 278 measures the pressure inside branch pipe 272 for second pump.

Further, the first pump 212a and the second pump 212b are intended to suck the resist solution at a predetermined pressure and to pressure-feed the sucked and loaded resist solution at a predetermined pressure, and are each composed of, for example, a tubephragm pump being a kind of a variable displacement pump. Each of the first pump 212a and the second pump 212b is partitioned by a flexible member into not-illustrated pump chamber and operating chamber.

The above pump chamber is communicated with the branch pipe 271 for first pump or the branch pipe 272 for second pump. Accordingly, by measuring the pressure in the branch pipe 271 for first pump by the pressure sensor 275, the pressure in the pump chamber of the first pump 212a can be measured. Further, by measuring the pressure in the branch pipe 272 for second pump by the pressure sensor 278, the pressure in the pump chamber of the second pump 212b can be measured.

Note that to each of the aforementioned operating chambers of the first pump 212a and the second pump 212b, a not-illustrated drive means for controlling the depressurization and pressurization of gas in the operating chamber is connected.

Further, a secondary side of the sending unit 212 and the coating nozzle 142 of each of the plurality of resist coating apparatuses 32 are connected with each other by a connecting pipe 280. The connecting pipe 280 is common among the plurality of resist coating apparatuses 32, namely, includes a main pipe 281 common among the plurality of the coating nozzles 142 and a plurality of branch pipes 282 branched from the main pipe 281 to the plurality of resist coating apparatuses 32.

To an upstream side end of the main pipe 281, downstream side ends of the branch pipe 271 for first pump and the branch pipe 272 for second pump are connected.

On each of the plurality of branch pipes 282, a pressure regulating valve 283, a pressure sensor 284, a flowmeter 285, and a dispense valve 286 are provided in order from the upstream side.

The pressure regulating valve 283 is intended to regulate the pressure inside the branch pipe 282 provided with the pressure regulating valve 283 by changing its opening degree, and functions as a constant-pressure valve which keeps the pressure inside the branch pipe 282 constant.

The pressure sensor 284 measures the pressure inside the branch pipe 282 provided with the pressure sensor 284. Based on the measurement result by the pressure sensor 284, the pressure regulating valve 283 is feedback-controlled for instance.

The flowmeter 285 measures the flow rate of the resist solution flowing through the inside of the branch pipes 282 provided with the flowmeter 285.

The dispense valve 286 is intended to switch between supply and non-supply of the resist solution to the coating nozzle 142, and includes, for example, an opening/closing valve and a suck-back valve.

For each of the valves provided in the resist solution supply apparatus 200, an electromagnetic valve or an air-operated valve controllable by the control unit U is used, and each of the valves and the control unit U are electrically connected with each other. Further, the control unit U is electrically connected to the pressure sensor 275, the pressure sensor 278, the pressure sensors 284, and the flowmeters 285. This configuration enables a series of treatments in the resist solution supply apparatus 200 to be automatically performed under control of the control unit U.

Next, the operation of the resist solution supply apparatus 200 will be explained based on FIG. 7 to FIG. 15. Note that in the following drawings, pipes through which the resist solution flows are illustrated in thick lines to thereby omit the explanation of the open/closed states of some of the valves. Further, for simplification of the explanation, a space between the opening/closing valves 274, 277 and the dispense valves 286 are filled with the resist solution in advance.

(Loading into the Buffer Tank 210)

Figure 7:
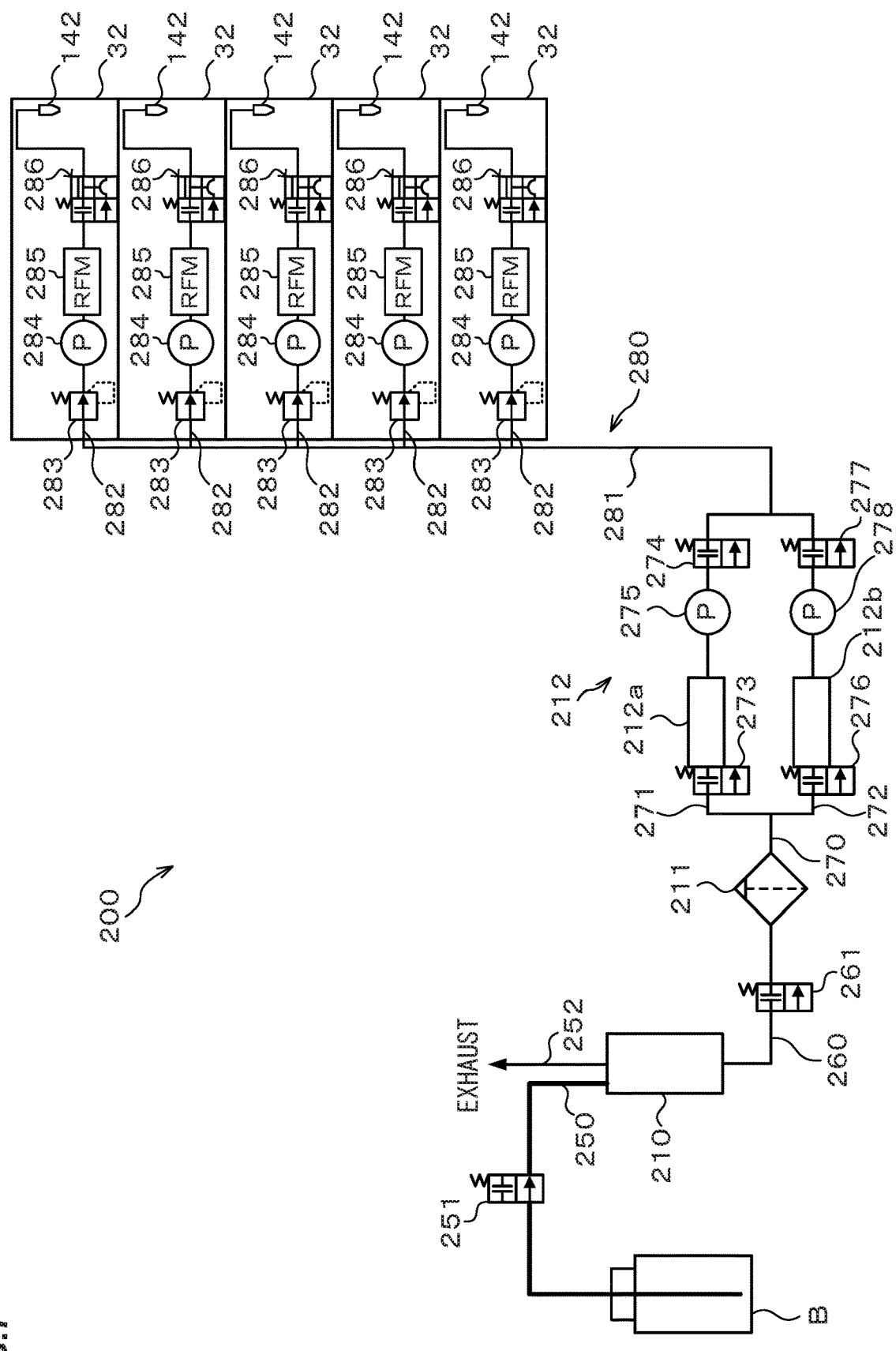
FIG. 7 illustrates a pipe system for explaining the outline of the configuration of the resist solution supply apparatus and is an explanatory diagram of a step of loading into a buffer tank.

As illustrated in FIG. 7, based on a control signal from the control unit, the supply valve 251 provided in the first supply pipe 250 is brought into an open state and the buffer tank 210 is made to suck the resist solution and load it into the buffer tank 210.

(First Loading into the First Pump 212a)

Figure 8:
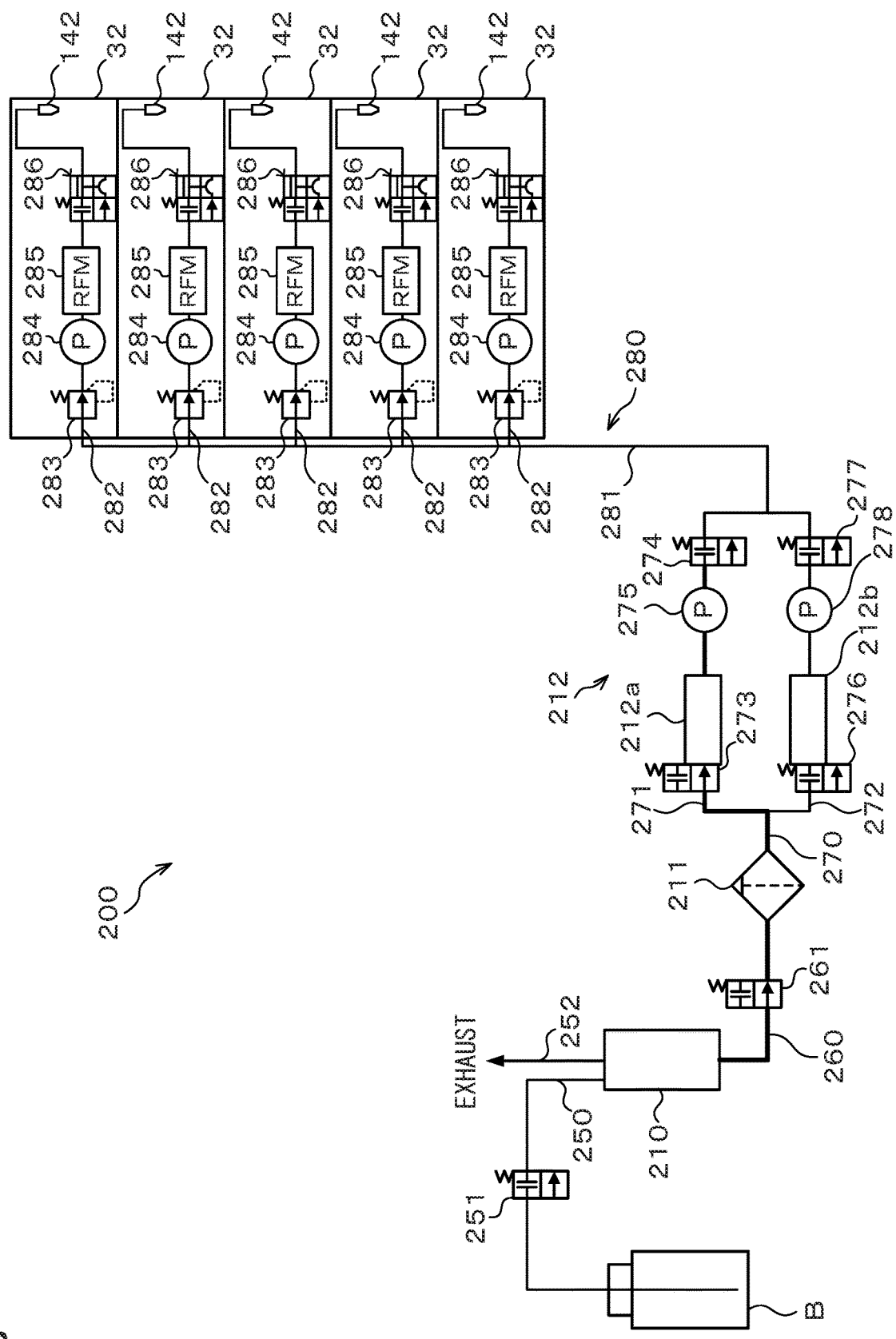
FIG. 8 illustrates the pipe system for explaining the outline of the configuration of the resist solution supply apparatus and is an explanatory diagram of a step of loading into a first pump.

When a predetermined amount of the resist solution is loaded into the buffer tank 210, as illustrated in FIG. 8, the supply valve 251 is brought into a closed state. In this event, the opening/closing valves 261, 273, 274, 276, 277 are in a closed state. Then, the drive means of the first pump 212a starts an exhaust operation in the operating chamber of the pump 212a, and the opening/closing valve 261 provided in the second supply pipe 260 and the opening/closing valve 273 provided in the branch pipe 271 for first pump are brought into an open state, and the suction of the resist solution in the buffer tank 210 by the first pump 212a is started. This makes the resist solution in the buffer tank 210 pass through the filter 211 and is transported to and loaded into the first pump 212a. Note that in the loading of the resist solution into the first pump 212a, the pressure in the branch pipe 271 for first pump, namely, the pressure in the pump chamber of the first pump 212a is measured by the pressure sensor 275, and the operation of the drive means of the first pump 212a based on the measurement result keeps the pressure in the pump chamber constant at a predetermined pressure.

(First Loading into the Second Pump 212b)

Figure 9:
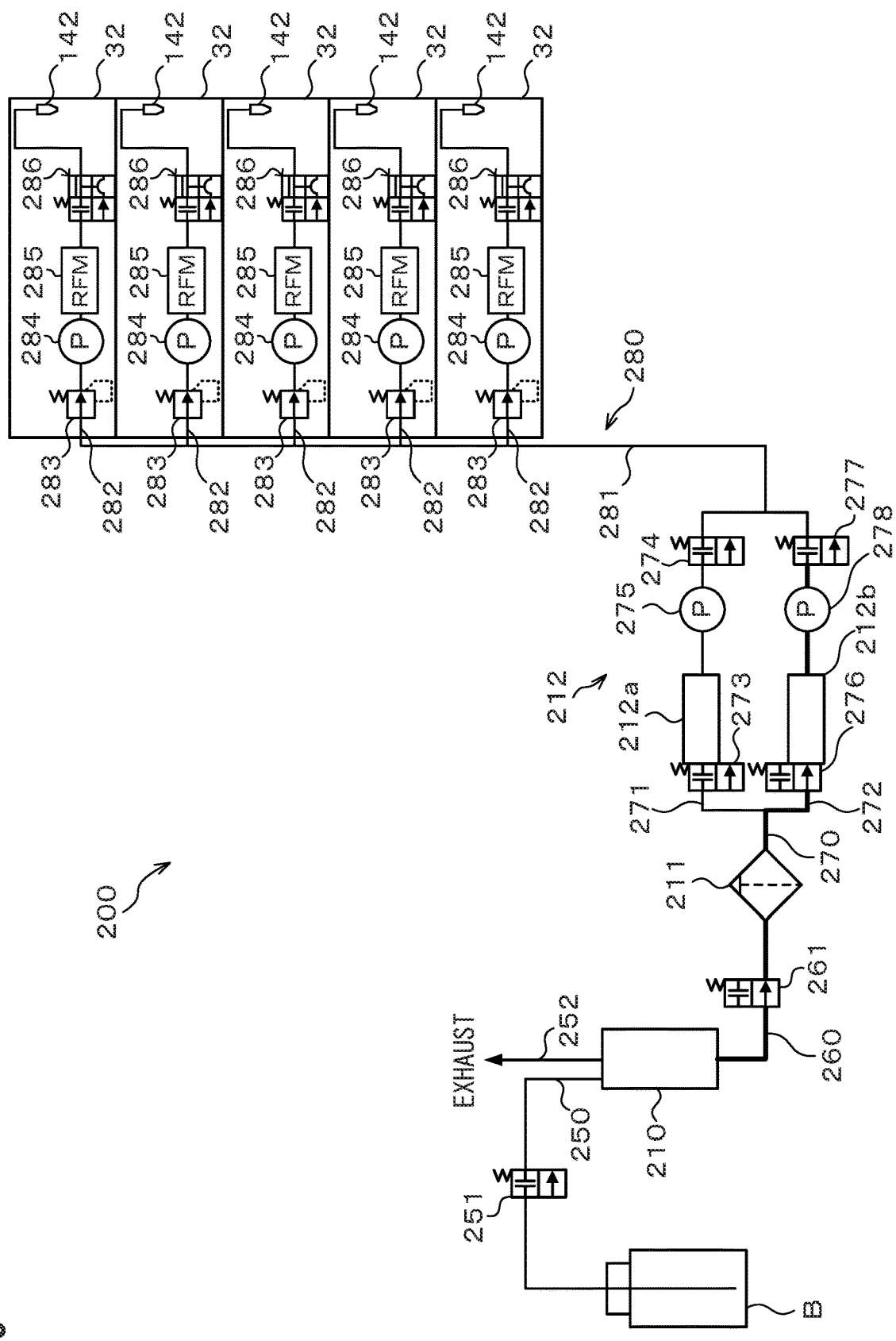
FIG. 9 illustrates the pipe system for explaining the outline of the configuration of the resist solution supply apparatus and is an explanatory diagram of a step of loading into a second pump.

When a predetermined amount of the resist solution is loaded into the first pump 212a, as illustrated in FIG. 9, the opening/closing valve 273 is brought into a closed state, and the exhaust operation in the operating chamber of the first pump 212a by the drive means of the pump 212a is stopped. Then, the drive means of the second pump 212b starts an exhaust operation in the operating chamber of the pump 212b, the opening/closing valve 276 provided in the branch pipe 272 for second pump is brought into an open state, and the suction of the resist solution in the buffer tank 210 by the second pump 212b is started. This makes the resist solution in the buffer tank 210 pass through the filter 211 and is transported to and loaded into the second pump 212b. Note that in the loading of the resist solution into the second pump 212b, the pressure in the branch pipe 272 for second pump, namely, the pressure in the pump chamber of the second pump 212b is measured by the pressure sensor 278, and the operation of the drive means of the second pump 212b based on the measurement result keeps the pressure in the pump chamber constant at a predetermined pressure.

Figure 10:
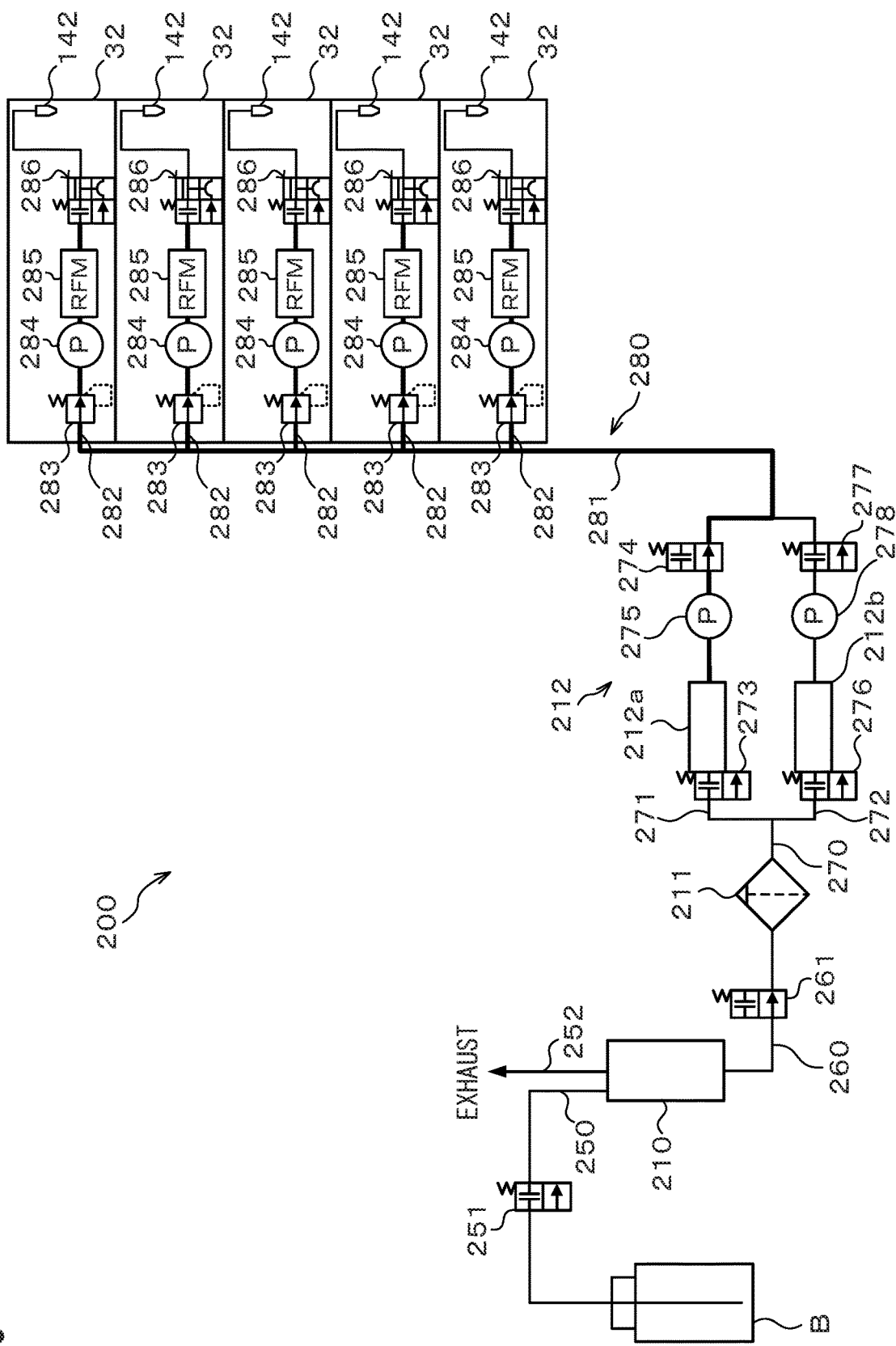
FIG. 10 illustrates the pipe system for explaining the outline of the configuration of the resist solution supply apparatus and is an explanatory diagram of a step of constant-pressure sending from the first pump.

When a predetermined amount of the resist solution is loaded into the second pump 212b, as illustrated in FIG. 10, the opening/closing valves 261, 276 are brought into a closed state, and the exhaust operation in the operating chamber of the second pump 212b by the drive means of the pump 212b is stopped.

(Discharge)

Upon completion of the loading of the resist solution into the first pump 212a and the second pump 212b, a pressurizing operation in the operating chamber of the first pump 212a by the drive means of the pump 212a or a pressurizing operation in the operating chamber of the second pump 212b by the drive means of the pump 212b is started.

In the former case, concurrently with the start of the pressurizing operation, the opening/closing valve 274 is brought into an open state to create a state enabling the pressure feed of the resist solution from the first pump 212a to the connecting pipe 280 as illustrated in FIG. 10. Note that the pressure in the branch pipe 271 for first pump, namely, the pressure in the pump chamber of the first pump 212a is measured by the pressure sensor 275. Further, the operation of the drive means of the first pump 212a based on the measurement result keeps the pressure in the pump chamber constant at a predetermined pressure (for example, 180 kPa), so that the sending of the resist solution from the first pump 212a is performed at the constant pressure.

Figure 11:
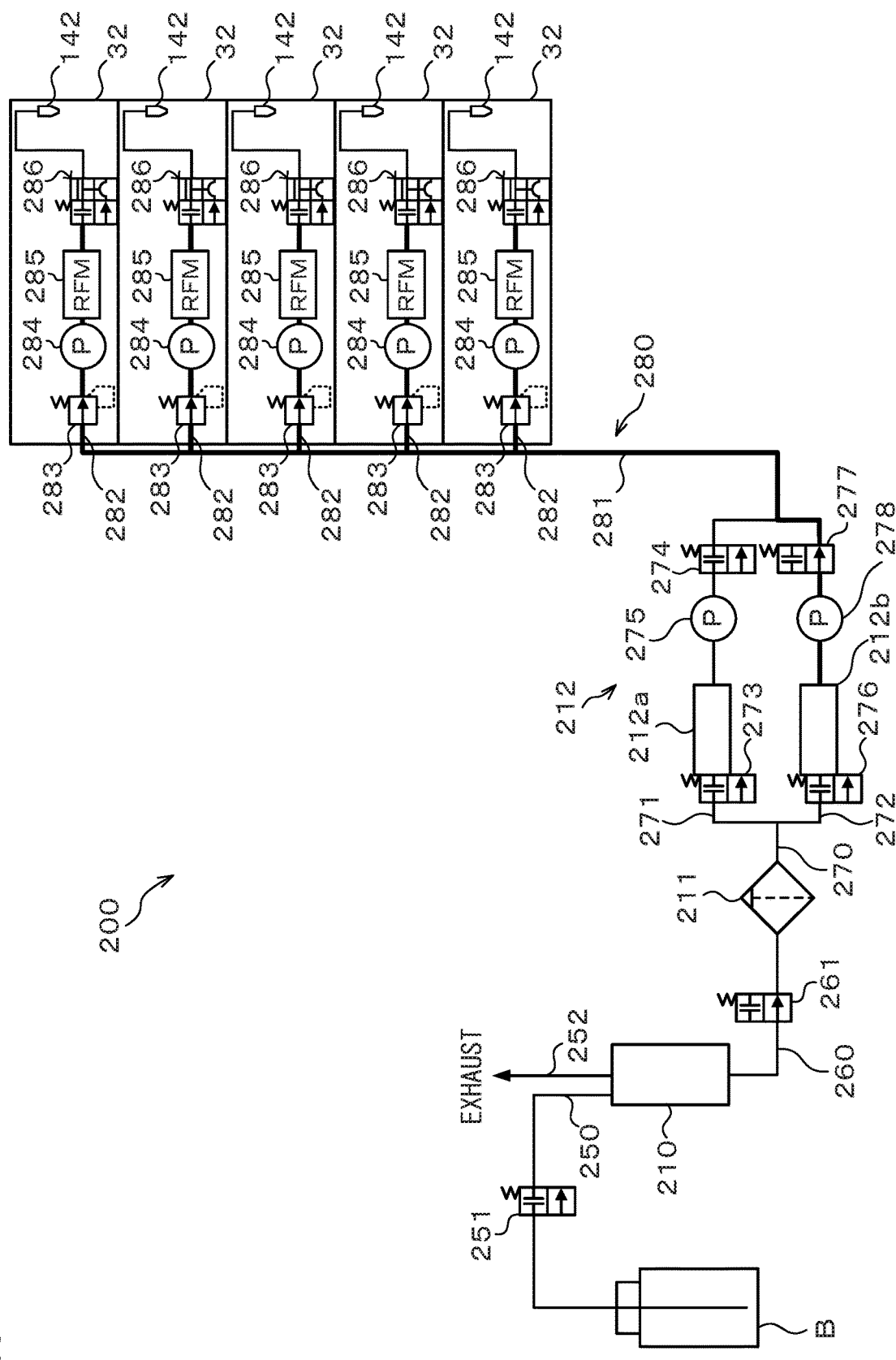
FIG. 11 illustrates the pipe system for explaining the outline of the configuration of the resist solution supply apparatus and is an explanatory diagram of a step of constant-pressure sending from the second pump.
Figure 12:
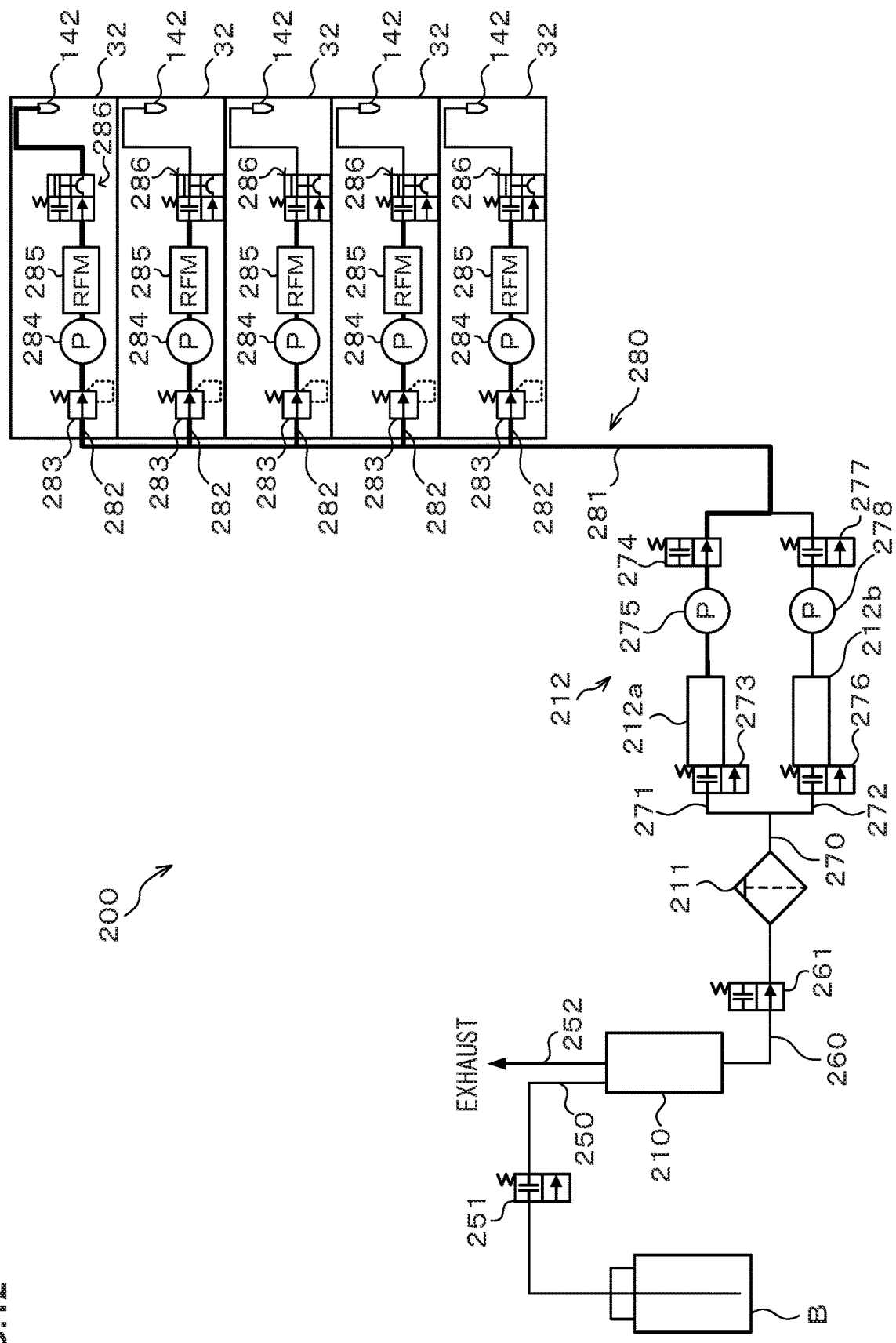
FIG. 12 illustrates the pipe system for explaining the outline of the configuration of the resist solution supply apparatus and is an explanatory diagram of a discharge step.

In the latter case, concurrently with the start of the pressurizing operation, the opening/closing valve 277 is brought into an open state to create a state enabling the pressure feed of the resist solution from the second pump 212b to the connecting pipe 280 as illustrated in FIG. 11. Note that the pressure in the branch pipe 272 for second pump, namely, the pressure in the pump chamber of the second pump 212b is measured by the pressure sensor 278. Further, the operation of the drive means of the second pump 212b based on the measurement result keeps the pressure in the pump chamber constant at a predetermined pressure (for example, 180 kPa), so that the sending of the resist solution from the second pump 212b is performed at the constant pressure.

As illustrated in FIG. 10 or FIG. 11, when the dispense valve 286 provided in the branch pipe 282 connected to the coating nozzle 142 that is an object of a discharge operation is brought into an open state in a state where the sending at a constant pressure (hereinafter, referred to as a constant-pressure sending state) of the resist solution from the first pump 212a or the second pump 212b to the connecting pipe 280 is possible, the resist solution is discharged onto the wafer via the nozzle 142. In an example of FIG. 12, the first pump 212a is in the constant-pressure sending state, and the dispense valve 286 corresponding to the coating nozzle 142 of the resist coating apparatus 32 at the uppermost stage being an object of the discharge operation is in an open state and the resist solution is being discharged from the nozzle 142. Note that the number of coating nozzles 142 being objects of the discharge operation at the same time is sometimes one or sometimes plural as illustrated in later-described FIG. 13.

Further, in the discharge from the coating nozzle 142, the pressure in the branch pipe 282 provided with the coating nozzle 142 is measured by the pressure sensor 284, and control of the pressure regulating valve 283 is performed based on the measurement result to keep the pressure of the resist solution to be supplied to the coating nozzle 142 constant at a predetermined pressure (for example, 30 kPa). In other words, the discharge rate of the resist solution from the coating nozzle 142 is made constant. Further, the time (period) during which the dispense valve 286 is in an open state is determined in advance, so that a predetermined amount of resist solution is discharged from the coating nozzle 142.

(Reloading into the First Pump 212a and the Second Pump 212b)

Once the supply of the resist solution from the first pump 212a or the second pump 212b to the coating nozzle 142, reloading of the resist solution into the first pump 212a or the second pump 212b becomes necessary.

Figure 13:
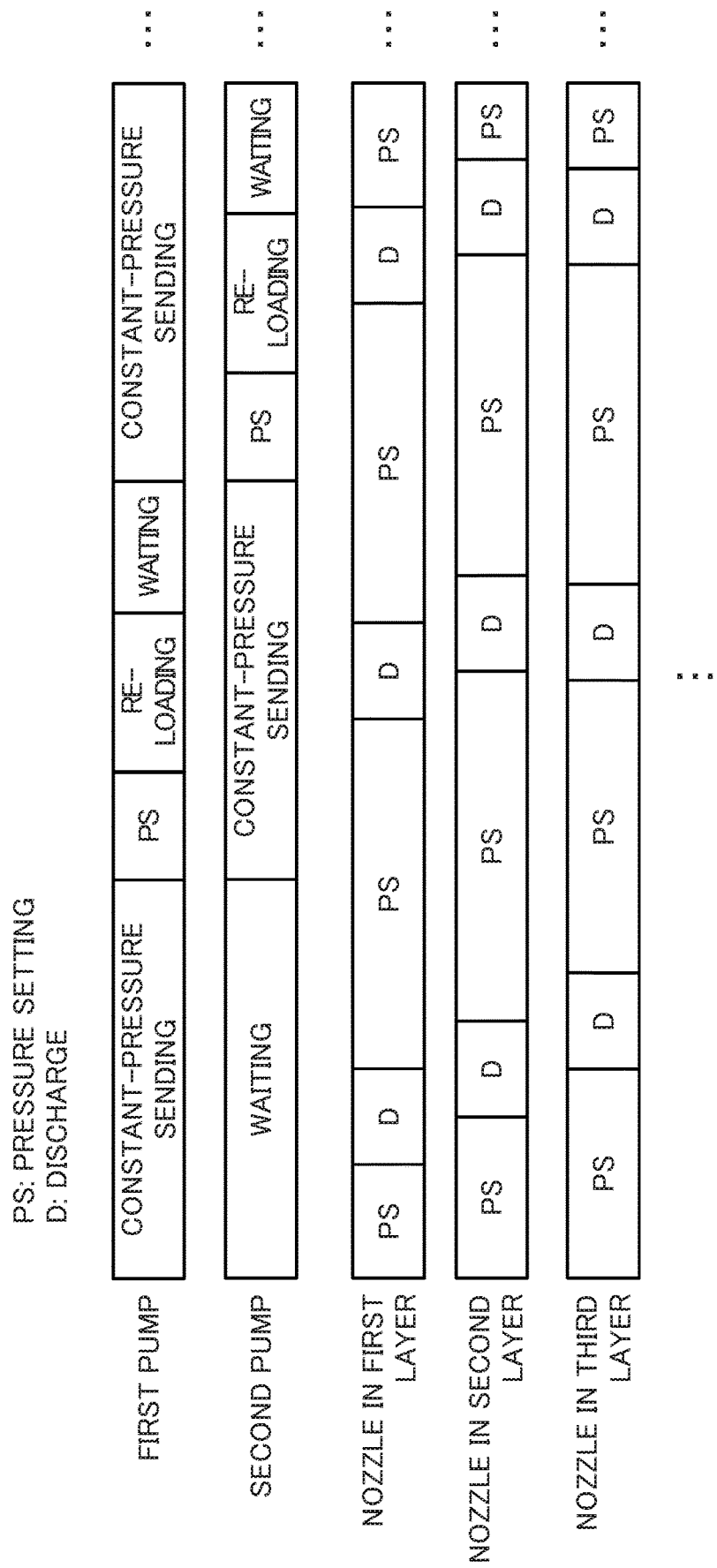
FIG. 13 is a timing chart illustrating operation states of pumps and nozzles.

The timing of reloading of the resist solution, namely, the suction timing of the resist solution is, for example, every time a predetermined period elapses or every time a predetermined amount of resist solution is sent, and is the timing when at least one of the first pump 212a and the second pump 212b becomes a state capable of sending the resist solution at all times as illustrated in FIG. 13. Specifically, for example, the reloading of the resist solution into the first pump 212a is performed at the time when the second pump 212b is in the constant-pressure sending state, and the reloading of the resist solution into the second pump 212b is performed at the time when the first pump 212a is in the constant-pressure sending state.

Figure 14:
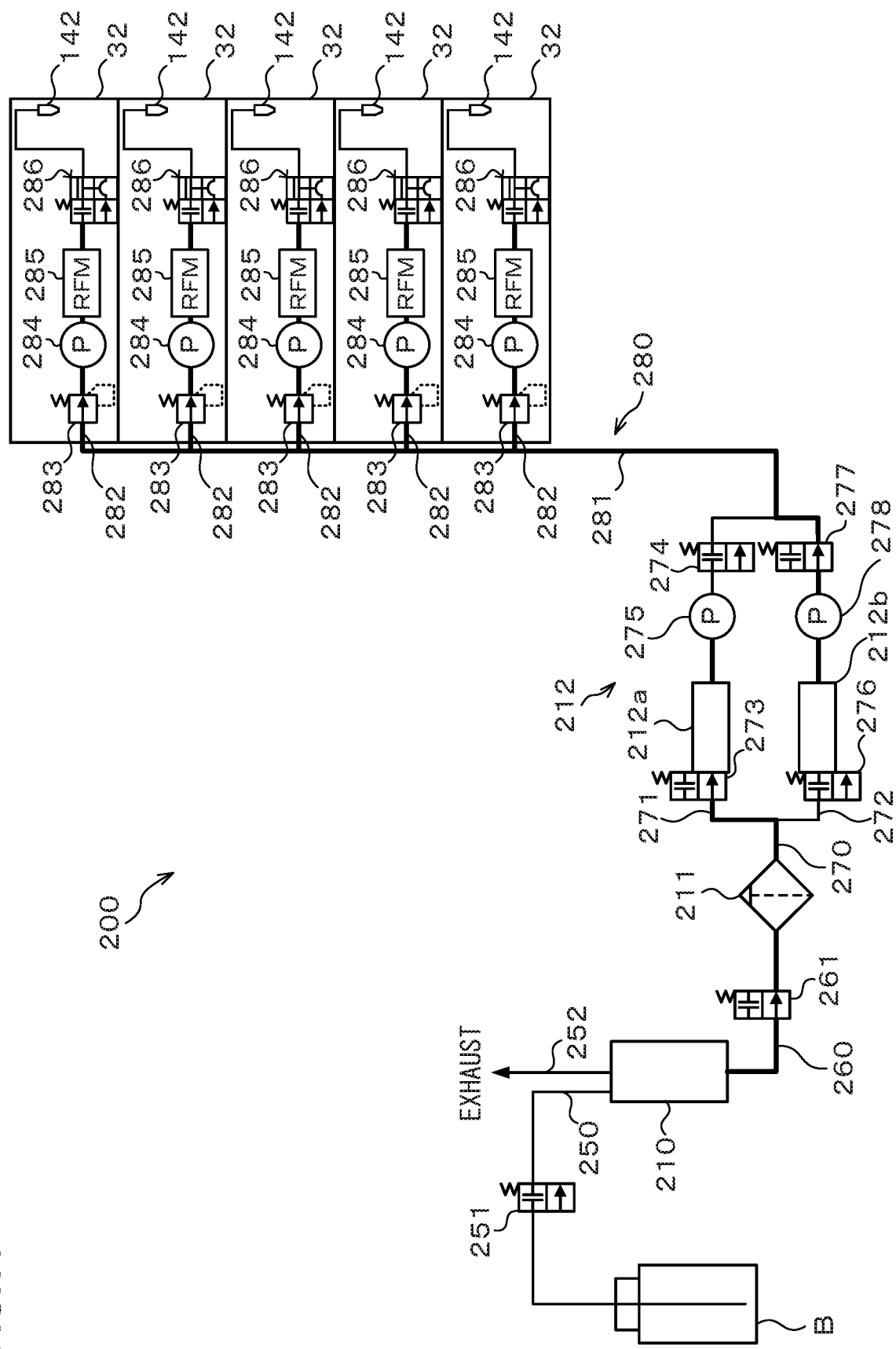
FIG. 14 illustrates the pipe system for explaining the outline of the configuration of the resist solution supply apparatus and is an explanatory diagram of a step of reloading into the first pump.

More specifically, the reloading of the resist solution into the first pump 212a is performed as follows. At the time when the pressurizing operation in the operating chamber of the second pump 212b is performed and the opening/closing valve 277 is in an open state as illustrated in FIG. 14, namely, when the second pump 212b is in the constant-pressure sending state, the exhaust operation in the operating chamber of the first pump 212a is performed and the opening/closing valves 261, 273 are brought into an open state, whereby the reloading of the resist solution into the first pump 212a is performed.

Figure 15:
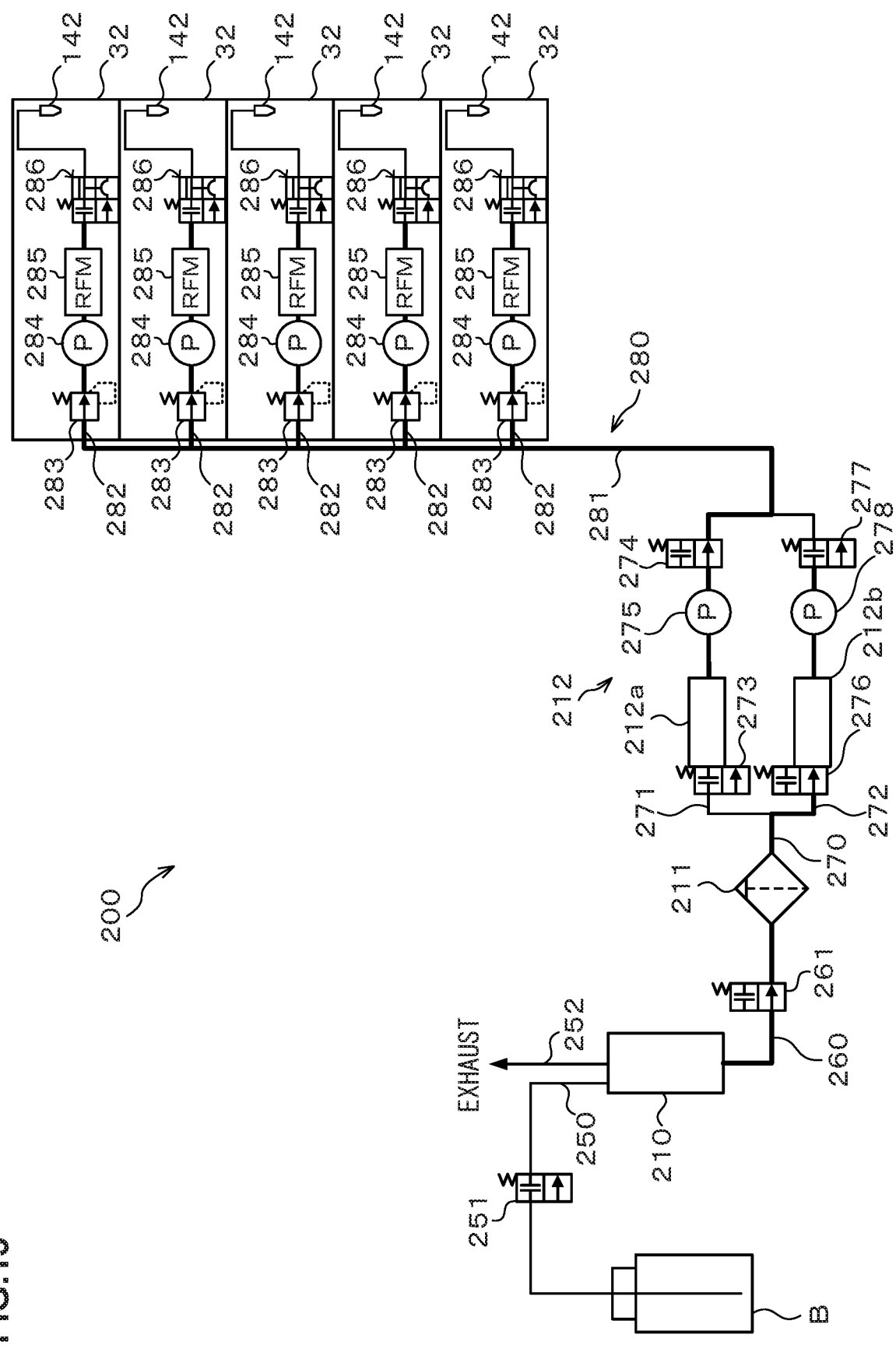
FIG. 15 illustrates the pipe system for explaining the outline of the configuration of the resist solution supply apparatus and is an explanatory diagram of a step of reloading into the second pump.

Besides, the reloading of the resist solution into the second pump 212b is performed as follows. At the time when the pressurizing operation in the operating chamber of the first pump 212a is performed and the opening/closing valve 274 is in an open state as illustrated in FIG. 15, namely, when the first pump 212a is in the constant-pressure sending state, the exhaust operation in the operating chamber of the second pump 212b is performed and the opening/closing valves 261, 276 are brought into an open state, whereby the reloading of the resist solution into the second pump 212b is performed.

Note that to prevent insufficiency in the first pump 212a or the second pump 212b at the discharge from the plurality of coating nozzles 142 at the same time, the capacities of the first pump 212a and the second pump 212b are larger than the conventional ones. For example, in the case where the number of coating nozzles 142 being supply destinations is five and the discharge amount from one coating nozzle 142 is 8 ml, the capacity of each of the first pump 212a and the second pump 212b is 80 ml.

Subsequently, an example of a method for setting a target pressure of the pressure regulating valve 283 and a method for setting the sending pressure of the first pump 212a and the second pump 212b will be explained.

In setting the target pressure of the pressure regulating valve 283, for example, the first pump 212a or the second pump 212b is brought into the constant-pressure sending state and the dispense valve 286 corresponding to the pressure regulating valve 283 is brought into an open state, and the resist solution is applied from the coating nozzle 142 corresponding to the pressure regulating valve 283. In this event, the valve opening degree of the pressure regulating valve 283 is regulated so that the flow rate of the resist solution measured by the flowmeter 285 becomes a predetermined flow rate, and the pressure measured by the pressure sensor 284 when the flowmeter 285 indicates the predetermined flow rate is set as the target pressure of the pressure regulating valve 283.

The setting of the target pressure is performed for all of the pressure regulating valves 283.

Then, the setting of the target sending pressures of the first pump 212a and the second pump 212b is performed.

In setting the sending pressure, namely, the supply pressure of the first pump 212a, first, the pump 212a is brought into the constant-pressure sending state and the dispense valves 286 of all of the coating nozzles 142 are brought into an open state to discharge the resist solution from all of the coating nozzles 142 at the same time. The sending pressure of the first pump 212a is regulated/set so that the pressure measured by the pressure sensor 284 corresponding to the coating nozzle 142 of the resist coating apparatus 32 at the uppermost stage becomes the target pressure at the pressure regulating valve 283 corresponding to the nozzle 142 in this event, namely, the feedback control to the target pressure of the pressure regulating valve 283 based on the measurement result of the pressure sensor 284 is possible in the coating nozzle 142 of the resist coating apparatus 32 at the uppermost stage. In this regulation/setting, the pressure regulation margin at the pressure regulating valve 283 is also taken into consideration.

This also applies to the method for setting the sending pressure of the second pump 212b.

According to this embodiment, the resist solution supply apparatus 200 is common among the resist coating apparatuses 32, thus making it possible to prevent the amount of particles in the resist solution supplied from the resist solution supply apparatus 200 and discharged from the coating nozzle 142 of the resist coating apparatus 32 to the wafer W and the amount of defects within the wafer subjected to the solution treatment using the resist solution, from differing among the resist coating apparatuses 32. Accordingly, the quality management in manufacturing the products such as the semiconductor chip and so on is easy.

Further, according to this embodiment, the resist solution supply apparatus 200 is common among the resist coating apparatuses 32, so that the number of parts such as the pump and so on can be reduced to suppress the manufacturing cost.

Further, according to this embodiment, the suction/loading timing of the resist solution of each of the first pump 212a and the second pump 212b is controlled so that at least one of the first pump 212a and the second pump 212b becomes a state capable of sending the resist solution to the resist coating apparatus 32 at all times. Therefore, the discharge of the resist solution from the coating nozzle 142 of the resist coating apparatus 32 is never hindered by the suction/loading.

Furthermore, according to this embodiment, the pressure regulating valve 283 is controlled so that the measurement result by the pressure sensor 284 becomes the target pressure in each of the plurality of branch pipes 282. Accordingly, when the resist solution is discharged from the plurality of coating nozzles 142 at the same time, the resist solution can be discharged from each of the coating nozzles 142 at the same discharge rate. Further, even if there is a pump head difference among the coating nozzles 142, the resist solution can be discharged from each of the coating nozzles 142 at the same discharge rate. Further, the difference among the coating nozzles 142 at portions on the downstream side of the pressure regulating valves 283 can be reduced.

Further, according to this embodiment, the target sending pressures of the first pump 212a and the second pump 212b are set so that the feedback control to the target pressure of the pressure regulating valve 283 based on the measurement result of the pressure sensor 284 for the coating nozzle 142 of the resist coating apparatus 32 at the uppermost stage is possible even when the dispense valves 286 for all of the coating nozzles 142 are brought into an open state as described above. Accordingly, even when there is a need to discharge the resist solution from all of the coating nozzles 142 at the same time, a predetermined amount of resist solution can be discharged from all of the coating nozzles 142.

Note that in the above embodiment, in loading the resist solution into the first pump 212a and the second pump 212b, the loading is performed only by sucking operations of the first pump 212a and the second pump 212b. When the pressure loss is large such as the case where the viscosity of the resist solution is high or the like, the resist solution in the buffer tank 210 may be pressure-fed from the buffer tank 210 in addition to the sucking operations of the first pump 212a and the second pump 212b. This enables rapid loading into the first pump 212a and the second pump 212b.

The number of pumps included in the sending unit is two in the above example but may be three or more.

Besides, one diaphragm pump, namely, variable displacement pump is included as the buffer tank 210 in the above embodiment. However, as in the sending unit 212, the buffer tank may be composed of a plurality of variable displacement pumps and the timing of suction/loading of the resist solution into the buffer tank may be controlled so that at least one of the plurality of variable displacement pumps becomes a state capable of sending the resist solution to the plurality of solution treatment apparatuses at all times.

Further, the sending unit 212 is located below the resist coating apparatus 32 at the lowermost stage in the above example. However, the sending unit 212 may be located at almost the same height as the resist coating apparatus 32 at the uppermost stage, may be arranged at a position higher than the resist coating apparatus 32 at the uppermost stage, or may be at almost the same height as the resist coating apparatus 32 at a middle stage.

Further, the resist coating apparatuses 32 which are supply destinations of the resist solution supply apparatus 200 are layered in the above example, but may be arranged side by side in a horizontal direction.

Note that the method for setting the sending pressure of the first pump 212a may be as follows.

All of the valves on the downstream side of the first pump 212a are brought into an open state and the pressure regulating valves 283 are brought into a full open state, and a pressure obtained by adding the pressure regulation margin to the pressure measured by the pressure sensor 275 at the time when the predetermined flow rate is obtained at the flowmeter 285 at the uppermost stage may be set as the sending pressure of the first pump 212a. This also applies to the second pump 212b.

The substrate is a semiconductor wafer in the above explanation, but the substrate is not limited to this but may be, for example, a glass substrate, an FPD (Flat Panel Display) substrate or the like.

Further, the treatment solution is the resist solution in the above explanation, but may be a coating solution for forming a coating film different from the resist film, for example, a coating solution for forming an SOC (Spin On Carbon) film, an SOD (Spin on Dielectric) film, or an SOG (Spin on Glass) film. Further, the treatment solution is not limited to the coating solution but may be a developing solution or the like.

It should be considered that the embodiment disclosed herein is an example only in all respects and is not restrictive. The above embodiment may be omitted, substituted and modified in various forms without departing from the attached claims and the spirit thereof

What is claimed is:

1. A treatment solution supply apparatus for supplying a treatment solution to a solution treatment apparatus which applies the treatment solution to a substrate to perform a predetermined treatment,
    there being a plurality of solution treatment apparatuses which are supply destinations of the treatment solution, the treatment solution supply apparatus comprising:
    a sending unit common among the plurality of solution treatment apparatuses, the sending unit being configured to send the treatment solution stored in a treatment solution supply source which stores the treatment solution, to each of the plurality of solution treatment apparatuses;
    a plurality of branch pipes branched from the sending unit to the plurality of solution treatment apparatuses, respectively,
        wherein each of the plurality of branch pipes is provided with a pressure measurement unit configured to measure a pressure in the branch pipe and a pressure regulating valve configured to regulate the pressure in the branch pipe, wherein the pressure regulating valves can have different degrees of opening from each other; and
    a control unit configured to control at least the sending unit,
    wherein the sending unit comprises a plurality of pumps configured to suck the treatment solution and load the treatment solution thereinto and to send the loaded treatment solution, and
    wherein the control unit is configured to:
        control suction timing of each of the plurality of pumps so that at least one of the plurality of pumps becomes in a state capable of sending the treatment solution to the plurality of solution treatment apparatuses at all times; and
        control a degree of opening of each of the pressure regulating valves so that a measurement result by the corresponding pressure measurement unit becomes a target pressure in each of the plurality of branch pipes.

2. The treatment solution supply apparatus according to claim 1,
    wherein each of the plurality of branch pipes is provided with a flow rate measurement unit for the treatment solution flowing through the branch pipe, and
    wherein the target pressure in the pressure regulating valve in each of the plurality of branch pipes is a pressure that when the treatment solution is discharged from a treatment solution coating unit of the solution treatment apparatus corresponding to each of the plurality of branch pipes, a measurement result at the flow rate measurement unit becomes a predetermined flow rate.

3. The treatment solution supply apparatus according to claim 1,
    wherein the plurality of solution treatment apparatuses are layered, and
    wherein the control unit is configured to regulate a supply pressure of the treatment solution from each of the plurality of pumps so that when the treatment solution is discharged from the treatment solution coating units of all of the plurality of solution treatment apparatuses at the same time, a measurement result at the pressure measurement unit corresponding to the solution treatment apparatus at an uppermost stage becomes the target pressure.

4. The treatment solution supply apparatus according to claim 2,
    wherein the plurality of solution treatment apparatuses are layered, and
    wherein the control unit is configured to regulate a supply pressure of the treatment solution from each of the plurality of pumps so that when the treatment solution is discharged from the treatment solution coating units of all of the plurality of solution treatment apparatuses at the same time, a measurement result at the pressure measurement unit corresponding to the solution treatment apparatus at an uppermost stage becomes the target pressure.

* * * * *